(12) United States Patent
Weybright et al.

(10) Patent No.: US 6,403,423 B1
(45) Date of Patent: Jun. 11, 2002

(54) MODIFIED GATE PROCESSING FOR OPTIMIZED DEFINITION OF ARRAY AND LOGIC DEVICES ON SAME CHIP

(75) Inventors: Mary E. Weybright, Pleasant Valley; Gary Bronner, Stormville; Richard A. Conti, Mt. Kisco; Ramachandra Divakaruni, Somers, all of NY (US); Jeffrey Peter Gambino, Westford, VT (US); Peter Hoh, Hopewell Junction, NY (US); Uwe Schroeder, Dresden (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/713,272

(22) Filed: Nov. 15, 2000

(51) Int. Cl.[7] .............................................. H01L 21/336
(52) U.S. Cl. ....................... 438/279; 438/200; 438/275; 438/241
(58) Field of Search ................................ 438/275, 200, 438/279, 241

(56) References Cited

U.S. PATENT DOCUMENTS

| | | | |
|---|---|---|---|
| 4,886,569 A | * 12/1989 | Ojha et al. | |
| 4,957,877 A | *  9/1990 | Tam et al. | 438/264 |
| 4,986,877 A | *  1/1991 | Tachi et al. | |
| 6,039,625 A | *  3/2000 | Matsubara et al. | 257/315 |
| 6,069,038 A | *  5/2000 | Hashimoto et al. | 438/235 |
| 6,071,799 A | *  8/2000 | Park et al. | 438/595 |
| 6,096,595 A | *  8/2000 | Huang | 438/210 |
| 6,214,675 B1 | *  4/2001 | Cochran et al. | 438/157 |
| 6,235,574 B1 | *  5/2001 | Tobben et al. | 438/210 |

FOREIGN PATENT DOCUMENTS

| | | | | |
|---|---|---|---|---|
| JP | 02197136 A | * | 8/1990 | H01L/21/336 |
| JP | 03108314 A | * | 5/1991 | H01L/21/027 |

* cited by examiner

Primary Examiner—John F. Niebling
Assistant Examiner—Jennifer M. Kennedy
(74) Attorney, Agent, or Firm—Scully, Scott, Murphy & Presser; Daryl K. Neff, Esq.

(57) ABSTRACT

Two different gate conductor dielectric caps are used in the array and support device regions so that the bitline contact can be fabricated in the array region, but a thinner hard mask can be used for better linewidth control in the support device region. The thinner dielectric cap is made into dielectric spacers in the array device regions during support mask etching. These dielectric spacers allow for the array gate conductor resist line to be made-smaller than the final gate conductor linewidth. This widens the array gate conductor processing window. The second dielectric cap layer improves linewidth control for the support devices and the array devices. Two separate gate conductor lithography steps and gate conductor dielectric etches are carried out in the present invention to optimize the gate conductor linewidth control in the array and support device regions. The gate conductors in the array and support devices regions are etched simultaneously to reduce production cost. In additional embodiments of the invention, dual workfunction support device transistors with or without salicide can be fabricated with an array including borderless contacts.

30 Claims, 15 Drawing Sheets

MODIFIED GATE PROCESSING FOR OPTIMIZED DEFINITION OF ARRAY AND LOGIC DEVICES ON SAME CHIP

FIELD OF THE INVENTION

The present invention relates to semiconductor device fabrication and more particularly to a process of fabricating an integrated circuit (IC) in which the gate conductor definition and contact etch processing are performed in the array (i.e., dynamic random access memory (DRAM) device) areas of the IC separately from those that are performed in the support (i.e., logic device) areas of the IC, such that the gate conductor linewidth is well controlled in both the array and support device areas with or without a borderless diffusion contact in the array.

BACKGROUND OF THE INVENTION

In the field of semiconductor device manufacturing, merged logic DRAM devices are becoming increasingly important. This is so since the coupling of logic devices with DRAM cells provides a device which has all the benefits of DRAMs, but having the speed of conventional logic devices to improve bandwidth and performance.

In merged devices, the gate conductor linewidth control is critical to metal oxide semiconductor field effect transistor (MOSFET) parameter control. On a typical DRAM or embedded DRAM chip, there are highly nested gate conductor lines at the minimum linewidth and minimum space in the array while there are gate conductor lines which are isolated or semi-isolated from the other gate conductor lines outside the array. The gate conductor linewidth control is critical to the field effect transistors (FETs) made inside and outside of the array. In addition to minimize area taken by the array, the bitline contact must be self-aligned to the gate conductor lines. This requires a relatively thick dielectric cap on the gate conductor.

Traditionally, all gate conductor shapes on a DRAM chip are defined with one critical lithography step, a single mask etch and a single gate etch in both nested and non-nested areas of the chip. The prior art processes are optimized for the array linewidth control to simultaneously achieve a borderless contact, and tight array gate conductor linewidth tolerance, yet not bridge the closely spaced gate conductor resist. Despite these optimizations, prior art processes are not optimal for the support transistor linewidth tolerances.

For example, the thick nitride cap required over the gate conductor in the array areas reduces linewidth tolerances in the support areas. The resist, ARC (anti-reflective coating), exposure conditions and mask open etch are optimized for the array equal line/space at minimum dimensions. No consideration is however given in the prior art of optimizing the support gate conductor linewidth tolerance. The dielectric cap thickness, the gate conductor lithography and the gate conductor mask open etch are the main contributors to the gate conductor linewidth control.

Moreover, the present processing of DRAM structures in the array areas suffers from poor $V_T$ (threshold voltage) tolerance of small geometry array devices. Standard scaling rules which call for increased well doping concentration also cause increase electric fields that are detrimental to the several leakage constraints on the DRAM array structures. In addition, the tight spacing between the wordlines impedes standard halo implants and there are limits even with the bitline only halo implantation schemes. Consequently, there is a strong need for self-aligned halo schemes in the dense DRAM array.

In view of the drawbacks mentioned hereinabove in regard to prior art merged logic DRAM processing, there is a continued need to develop a new and improved processing scheme which provides a tight effective gate length, $L_{eff}$, tolerance in the support devices as well as an improved $V_T$ tolerance in the array devices.

Good control of the gate conductor linewidth is needed to: (i) control the sub-threshold leakage current of the DRAM access transistor in the array areas because a gate conductor that is too narrow may lead to high leakage current (when the transistor is off) and therefore shorten retention time for refreshing the memory cell; (ii) control on-current of the DRAM access transistor in the array regions since a gate conductor that is too wide may lead to insufficient device current and reduced signal margin; and (iii) obtain gate conductor patterns in the support areas that are the correct width because a gate conductor that is too wide causes the transistor to switch more slowly between logic levels, and a gate conductor that is too narrow leads to undesirably high leakage current when the transistor is off.

SUMMARY OF THE INVENTION

One object of the present invention is to provide a method of fabricating a semiconductor IC in which the gate conductor linewidth is well controlled in both the array areas and the support areas of the semiconductor IC while providing a borderless contact in the array areas.

Another object of the present invention is to provide a method of fabricating a semiconductor IC in which the array $V_T$ tolerance is improved.

These and other objects and advantages are achieved in the present invention by utilizing two different gate conductor dielectric caps. The different gate conductor dielectric caps are used in the array and support device regions so that the bitline contact can be fabricated in the array region, but a thinner hard mask can be used for better linewidth control in the support device region.

The thinner dielectric cap is made into dielectric spacers in the array device regions during the support mask etch. These dielectric spacers allow for the array gate conductor resist line to be made smaller than the final gate conductor linewidth and the resist line spacing to be wider than the final array line spacing This widens the array gate conductor processing window. Thus the second dielectric cap layer improves linewidth control for the support devices and the array devices. Two separate gate conductor lithography steps and gate conductor dielectric etches are carried out in the present invention to optimize the gate conductor linewidth control in both the array and support device regions. The gate conductors in the array and support device regions are etched simultaneously to reduce production cost.

In a first embodiment of the present invention, the method comprises the steps of:

(a) forming a gate conductor stack on a surface of a gate dielectric, said gate dielectric is formed on a surface of a semiconductor substrate having at least one array device region and at least one support device region;

(a) forming a first gate dielectric cap on at least the gate conductor stack in said at least one array device region;

(c) selectively patterning and etching the first gate dielectric cap in said at least one array device region, said first gate dielectric cap not being present in said at least one support device region after said etching;

(d) forming a second gate dielectric cap on all exposed surfaces in said at least one array device region and in said at least one support device region, said second gate dielectric cap being thinner than said first gate dielectric cap;

(e) selectively etching said second gate dielectric cap in said at least one array device region and in said at least one support device region, wherein said second etched gate dielectric cap in said at least one support device region serves as a gate conductor mask; and (f) simultaneously etching exposed surfaces of said gate conductor stack in both said at least one array device region and said at least one support device region stopping on said gate dielectric, wherein said simultaneous etching provides a plurality of patterned gate stacks in both said at least one array device region and said at least one support device region.

The structure provided by steps (a)–(f) may then be subjected to conventional ion implantation which forms diffusion regions in the substrate and other conventional post gate stack processing may also be employed in forming the borderless bitline contacts.

In a second embodiment of the present invention, the method comprises the steps of:

(a) forming a gate conductor stack on a surface of a gate dielectric, said gate dielectric is formed on a surface of a semiconductor substrate having at least one array device region and at least one support device region;

(b) forming a first gate dielectric cap on at least the gate conductor stack in said at least one array device region;

(c) selectively patterning and etching the first gate dielectric cap in said at least one array device region, said first gate dielectric cap not being present in said at least one support device region after said etching;

(d) forming a second gate dielectric cap on all exposed surfaces in said at least one array device region and in said at least one support device region, said second gate dielectric cap being thinner than said first gate dielectric cap;

(e) selectively etching said second gate dielectric cap in said at least one array device region and in said at least one support device region, wherein said second etched gate dielectric cap in said at least one support device region serves as a gate conductor mask;

(f) block masking said support device region;

(g) etching exposed surfaces of said gate conductor stack in said at least one array device region stopping on said gate dielectric;

(h) depositing a barrier layer over at least said array device region;

(i) depositing a dielectric layer over said array device region and said support device region;

(j) depositing and patterning a photoresist to form patterning over said support device region while protecting said array device region; and (k) etching said gate conductor stack in said support device region.

In a third embodiment of the present invention, the method comprises the steps of:

(a) forming a gate conductor stack having an upper portion and a lower portion comprising undoped silicon on a surface of a gate dielectric, said gate dielectric is formed on a surface of a semiconductor substrate having at least one array device region and at least one support device region;

(b) forming a first gate dielectric cap on at least the gate conductor stack in said at least one array device region;

(c) selectively patterning and etching the first gate dielectric cap and said upper portion in said at least one array device region, said first gate dielectric cap and said upper portion not being present in said at least one support device region after said etching;

(d) forming a second gate dielectric cap on all exposed surfaces in said at least one array device region and in said at least one support device region, said second gate dielectric cap being thinner than said first gate dielectric cap;

(e) selectively etching said second gate dielectric cap in said at least one array device region to form sidewall spacers on said first etched gate dielectric cap;

(f) implanting a first dopant of a first charge carrier type into said exposed lower portion in said array device region;

(g) annealing said semiconductor substrate to drive said first dopant into said lower portion under said first dielectric cap;

(h) etching said exposed lower portion in said array device region;

(i) depositing a doped glass on said semiconductor substrate and removing said doped glass from said support device region;

(j) patterning said second dielectric cap in said support device region to expose and etch said lower portion in said support device region to form gate conductors;

(k) removing said second dielectric cap-on said gate conductors in said support device region and removing said gate dielectric between said gate conductors;

(l) implanting a second dopant of a second charge carrier type into said exposed lower portion of said gate conductor in said support device region; and (m) annealing said semiconductor substrate to drive said second dopant into said gate conductors in said support device regions, whereby gate conductors of said first charge carrier type are formed in said array device region and gate conductors of at least said second charge carrier type are formed in said support device region.

Optionally, another implantation step could be employed between steps (l) and (m) to implant a third dopant of a different charge carrier type into the lower portion of the gate conductor in the support device region. A block mask could be used to direct the dopant into the specific region. When a third implantation step is employed, annealing step (m) drives in both the second and third dopant.

In a fourth embodiment of the present invention, the method comprises the steps of:

(a) forming a gate conductor stack having an upper portion and a lower portion comprising undoped silicon on a surface of a gate dielectric, said gate dielectric is formed on a surface of a semiconductor substrate having at least one array device region and at least one support device region;

(b) forming a first gate dielectric cap on at least the gate conductor stack in said at least one array device region;

(c) selectively patterning and etching the first gate dielectric cap and said upper portion in said at least one array device region, said first gate dielectric cap and said upper portion not being present in said at least one support device region after said etching;

(d) forming a second gate dielectric cap on all exposed surfaces in said at least one array device region and in said at least one support device region, said second gate dielectric cap being thinner than said first gate dielectric cap;

(e) selectively etching said second gate dielectric cap in said at least one array device region to form sidewall spacers on said first etched gate dielectric cap;

(f) etching said gate conductor stack in said at least one array device region stopping on said gate dielectric;

(g) depositing and patterning a barrier layer over said array device region to define a gate conductor mask and to define borderless contact etch openings; and (h) etching said gate conductor stack and said support device region.

DETAILED DESCRIPTION OF THE INVENTION

Figure 1:
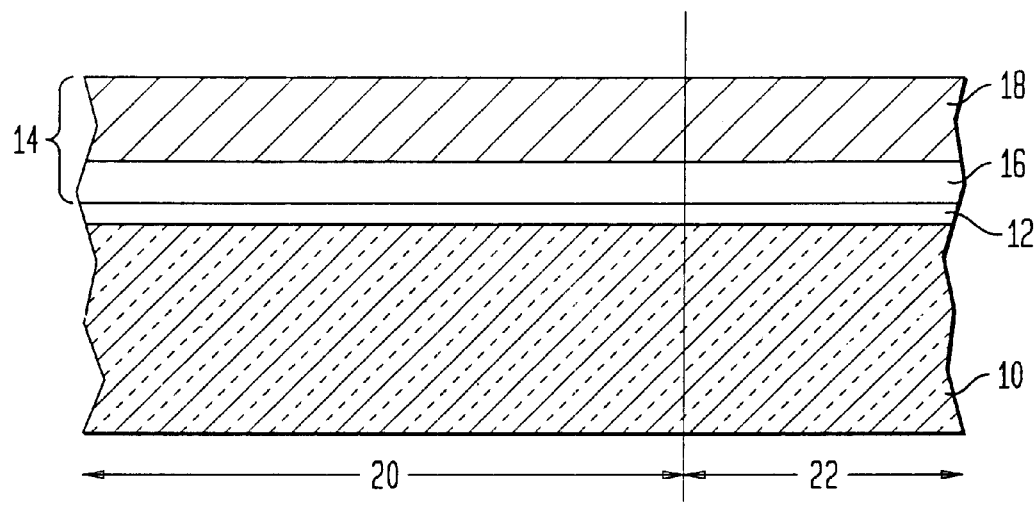
FIGS. 1–6 are cross-sectional views showing the basic processing steps of the first embodiment of the present invention.

The present invention which relates to a method for defining gate conductors in both array and support device regions of a semiconductor integrated circuit will now be described in more detail by referring to the drawings that accompany the present application. It should be noted that in the accompanying drawings like reference are used for describing like and/or corresponding elements.

Reference is first made to FIGS. 1–6 which illustrate the basic processing steps that are employed in a first embodiment of the present invention in fabricating a semiconductor IC in which the gate conductor linewidth in both the array and support device regions is well controlled. Specifically, FIG. 1 shows an initial structure that comprises a semiconductor substrate 10, gate dielectric 12 and gate conductor stack 14. The structure is broken-up to include at least one array device region 20 and at least one support device region 22. It is noted that although only one of each device region is shown in the drawings of the present invention, the inventive method works in cases wherein a plurality of array and support device regions are present in the structure. In FIG. 1, the gate conductor stack includes (doped or undoped) polysilicon layer 16 and silicide layer 18. It is noted that the gate conductor stack may be comprised of any conductor material or combination of conductive layers including, but not limited to: metal gates such as W/WN and W, or polysilicon and metal layers.

The structure shown in FIG. 1 is fabricated using conventional processing techniques well known to those skilled in the art and the structure is composed of conventional materials that are well known in the art.

For example, substrate 10 employed in the present invention is composed of any semiconducting material, including, but not limited to: Si, Ge, SiGe, GaP, InAs, InP and all other III/V compound semiconductors. The substrate may also be composed of a layered semiconductor such as Si/SiGe, Si/SiO$_2$/Si or silicon-on insulators (SOIs). The substrate may be of the n or p-type depending on the type of device or devices to be fabricated. Moreover, the substrate may contain various isolation regions such as shallow trench isolation (STI) regions, LOCOS (local oxidation of silicon) regions or other like isolation regions either formed in the substrate or on a surface thereof.

The substrate may also include trench capacitors, such as deep trench capacitors, formed in the array regions of the structure. For clarity, the isolation regions and trench capacitors are not shown in the drawings of the present invention, but are nevertheless intended to be included within substrate 10. Of the various substrates mentioned above, it is preferred that substrate 10 be composed of Si and that the array device region include at least one STI region and at least one deep trench capacitor.

It is noted that the present invention works equally well with any stack capacitor structure and it is not limited to those that include a deep trench. For example, the present invention works well on any IC where well controlled gate conductor linewidths are required in an array region and a support region simultaneously.

Gate dielectric 12 is formed on a surface of substrate 10 utilizing a conventional thermal growing process. Alternatively, the gate dielectric may be formed on the surface of substrate 10 utilizing a conventional deposition process such as chemical vapor deposition (CVD), plasma-assisted CVD, evaporation, or sputtering. The gate dielectric is typically composed of an oxide such as SiO$_2$ and its thickness is not critical to the present invention. Typically, however, the gate dielectric has a thickness of from about 2 to about 10 nm, with a thickness of from about 5 to about 7 nm being more preferred.

For the structure shown in the present application, gate conductor stack 14, which is formed on gate dielectric 12, is composed of polysilicon layer 16 and silicide layer 18. It should be noted that although illustration is provided for this type of gate conductor stack other gate conductor stacks may be employed in the present invention. The gate conductor stack is formed by first depositing polysilicon layer 16 (doped or undoped) utilizing a conventional deposition process such as CVD, plasma-assisted CVD, spin-on coating and other like deposition processes. When a doped polysilicon is to be deposited, a conventional in-situ doping deposition process, or deposition followed by ion implantation may be performed. The polysilicon layer employed in the invention typically has a thickness of from about 50 to about 100 nm, with a thickness of from about 60 to about 80 nm being more preferred.

Next, a more conductive material such as tungsten silicide, WSi$_x$, with x typically being between 2 and 2.8, is deposited utilizing a conventional deposition process such as sputtering, CVD, plating or evaporation. The thickness of the silicide layer is not critical to the present invention, but typically it has a thickness of from about 30 to about 60 nm.

Alternatively, a conductive metal such as W, Co, or Ti is formed on the surface of the polysilicon layer utilizing a conventional deposition process such as sputtering, CVD, plating or evaporation and thereafter the metal layer is subjected to an annealing process which is capable of converting the metal layer into a metallic silicide layer. Any remaining metal layer that is not silicided can be removed from the structure utilizing a conventional wet chemical etching process. The thickness of the silicide layer is not critical to the present invention, but typically it has a thickness of from about 30 to about 60 nm.

It is noted that a barrier layer (not shown in FIGS. 1–6) composed of a nitride such as WN, TaN, TiN, Ti or multilayers thereof may be formed between the polysilicon layer and the silicide layer. This optional barrier layer, which will be designated as reference numeral 17 in a subsequent drawing, is formed by conventional deposition processes such as CVD, plasma-assisted CVD, sputtering, plating or evaporation, and it typically has a thickness of from about 1 to about 10 nm.

Alternatively, the polysilicon may be replaced with a conductive metal layer such as W with a barrier, if needed to protect the gate dielectric.

Alternatively, the polysilicon could be used as the only layer of the gate conductor.

Figure 2:
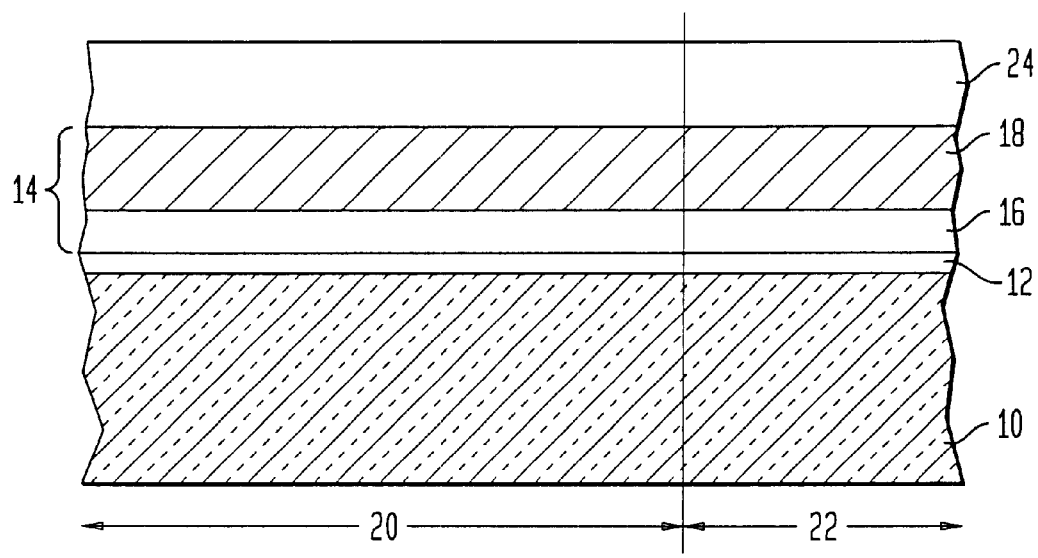

First gate dielectric cap 24 is formed on at least the gate conductor stack in array device region 20. In FIG. 2, which represents one embodiment of the present invention, the first gate dielectric cap is formed in both the array and support device regions. In another embodiment of the present invention, not shown in these drawings, the first dielectric cap is formed only in the array device regions of the structure. When such an embodiment is employed, the dielectric is deposited in all regions, a conventional blocking mask is required to be present in the array device regions, and the dielectric is etched from the open areas of the block mask which include all of the support regions and non-gate areas of the array device regions.

The first dielectric cap is formed utilizing a conventional deposition process such as CVD, plasma-assisted CVD, evaporation, sputtering, reactive sputtering or other like deposition processes. The first dielectric cap is composed of a nitride, e.g., $Si_3N_4$, an oxide, e.g., $SiO_2$, or other like material which is capable of serving as a hard masking layer and an insulator The thickness of the first dielectric cap is not critical to the present invention but its thickness should be greater than a second dielectric cap to be subsequently formed on the structure. Typically, the first dielectric cap has a thickness of from about 50 to about 100 nm.

Figure 3:
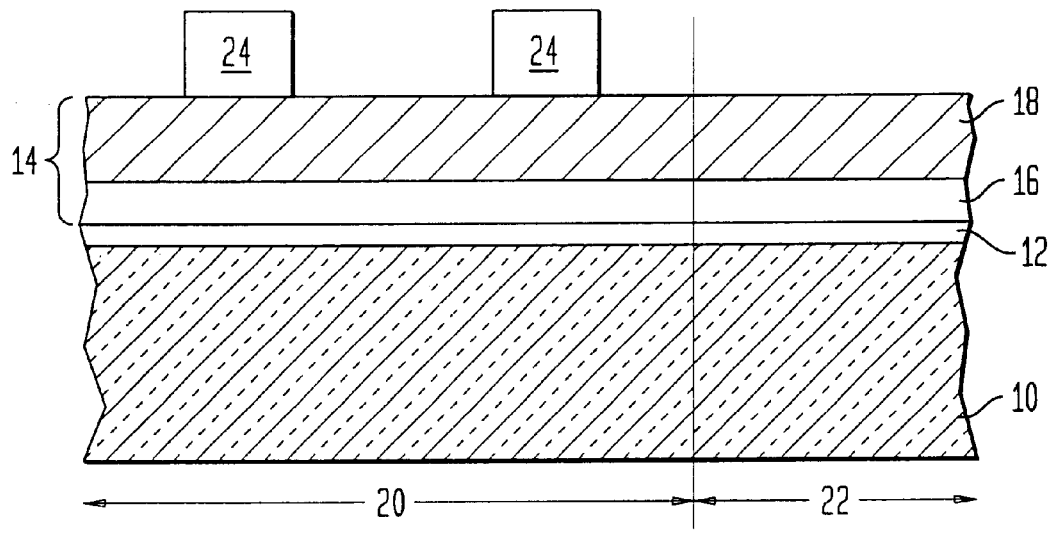

FIG. 3 illustrates the structure after selectively patterning and etching the first dielectric cap layer in the array device region of the structure. As is shown in FIG. 3, the etching process removes the first dielectric cap in the support device region. The structure shown in FIG. 3 is formed by utilizing a gate conductor lithography process that is optimized for the array.

In accordance with the present invention, the developed linewidth is set smaller than the final polysilicon linewidth requirement which widens the array gate conductor processing window. Specifically, the structure in FIG. 3 is formed by applying a conventional photoresist to at least the array device region of the structure, patterning the photoresist, developing the pattern and etching through the first dielectric cap. The etching is carried out utilizing any dry etching process such as reactive-ion etching (RIE), plasma-etching or ion beam etching. As stated above, during this etching process, the first dielectric cap, if present in the support device region, is also removed from the structure. The etching process may be selective to the gate conductor material, or alternatively, the etching process also removes a portion of the top gate conductor layer.

Following the above-mentioned etching process, the patterned photoresist in the array device region is stripped utilizing a conventional stripping process providing the patterned structure shown in FIG. 3. It is noted that this step of the present invention defines the gate conductor hard mask/dielectric cap for borderless contacts in the array device regions, while simultaneously removing the first dielectric cap in the support device regions.

Figure 4:
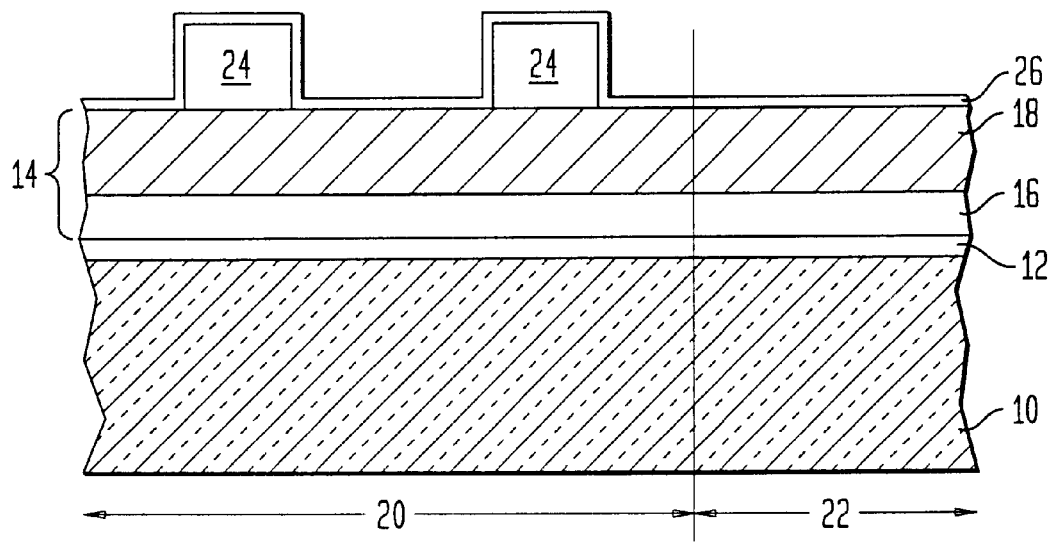

Next, as shown in FIG. 4, second dielectric cap 26 is formed on all exposed surfaces in the array and support device regions. In accordance with the present invention, the second dielectric cap is thinner than the first dielectric cap. A typical thickness for the second dielectric cap is from about 10 to about 30 nm. It is noted that the second dielectric cap serves as sidewall spacers in the array device regions and as a hard masking layer in the support device regions.

The second dielectric cap is formed utilizing the same or different deposition process as used in forming first dielectric cap 24. Moreover, the second dielectric cap may be formed of the same or different dielectric material as the first dielectric cap. In one embodiment of the present invention, the second dielectric cap is composed of $Si_3N_4$. In another embodiment of the present invention, the second dielectric cap is composed of an oxide formed from TEOS (tetraethylorthosilicate). In yet a further embodiment of the present invention, the second dielectric cap is composed of dual layer comprising $Si_3N_4$ and a doped silicate glass such as boron doped silicate glass.

It is noted that the second dielectric cap in the array device regions is formed into spacers that protect the gate conductor in the array regions from a subsequent bitline contact etch. In one embodiment of the present invention, an oxide is employed as the second dielectric cap since oxide is easier to pattern than nitride, thus providing an even better gate conductor linewidth control. When a dual layer of $Si_3N_4$ and doped silicate glass is employed, the doped silicate glass is typically removed with a conventional wet chemical etch process after formation of the array spacer and gate conductor etch.

Alternatively, the second dielectric can be used solely as a hard mask for the support device regions. In this case, second dielectric 26 is completely removed in the array region during support gate etching. No spacers are formed in the array and the array linewidth is determined by the first dielectric width (24) in region 20.

Figure 5:
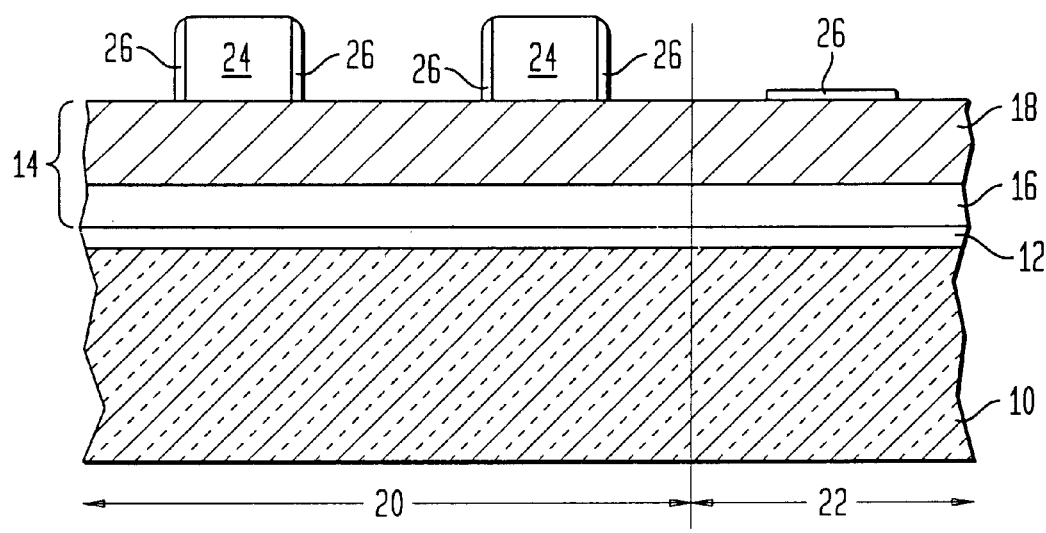

Reference is now made to FIG. 5 which illustrates the structure after performing a conventional anisotropic etching process that stops on the silicide layer of the gate conductor stack. The anisotropic etching process employed in the present invention forms a hard masking layer (See, reference number 26 in FIG. 5) for the gate conductor line definition and widens the gate conductor lines in the array regions to achieve the correct final array polysilicon width.

Figure 6:
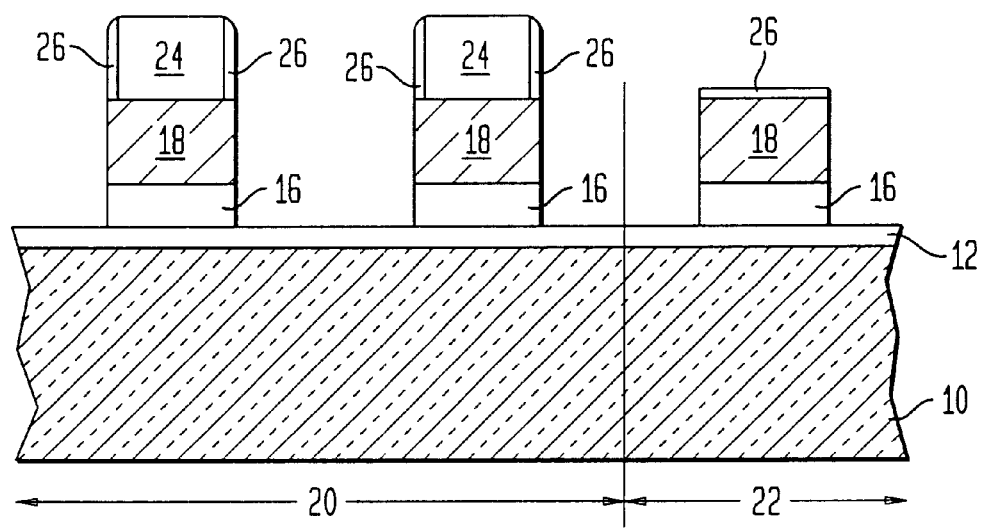

After the anisotropic etching step, the structure shown in FIG. 5 is subjected to an etch process which selectively removes exposed surfaces of the gate conductor stack in both the array and support device regions of the structure stopping on the gate dielectric so as to provide the structure shown in FIG. 6. The etching process employed in this step of the present invention is selective to the dielectric caps and to the underlying gate dielectric. The selective etch which may stop on, or in the gate dielectric layer, is carried out utilizing one of the above mentioned dry etching processes such as RIE. It is noted that spacers 26 in the array region are aligned with the vertical sidewalls of patterned layers 16 and 18.

At this point of the processing, diffusion regions can be formed in the substrate by utilizing conventional ion implantation techniques, or alternatively, the diffusion implants may be formed after subsequent spacer formation on the gate regions. Conventional $V_T$, halo, pocket and/or extension implants may also be performed at this point of the present invention. It is noted that the various diffusion regions created by these implants have been omitted from the drawings of the present invention for clarity.

It is emphasized that the structure shown in FIG. 6 is formed utilizing the basic processes steps of the present invention. The following description and corresponding figures relate to additional processing steps that can be employed in the present invention, or alternatively, the following description and corresponding figures relate to various embodiments that can be employed in the present invention.

Figure 7:
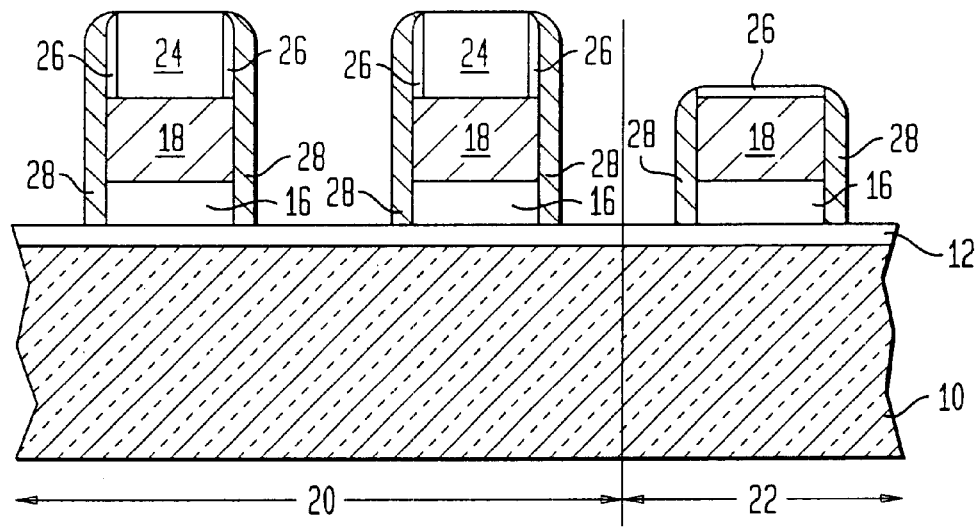
FIG. 7 is a cross-sectional view illustrating the structure of FIG. 6 after spacer formation in the array and support device regions of the structure.

FIG. 7 shows a structure in which silicon nitride spacers 28 are formed on the vertical sidewalls of the gate regions in both the array and support device regions. The silicon nitride spacers are formed by conventional techniques including deposition, e.g., low pressure CVD, of silicon nitride and etching, e.g., RIE. It is also within the contemplation of the present invention to form spacers 28 in the array regions of the structure only in areas between adjacent gate regions. When such an embodiment is employed, spacers 28 are formed by depositing the silicon nitride layer on all exposed surfaces of the structure, a photoresist mask (or dielectric material) is then applied to the silicon nitride layer and the mask is selectively patterned to expose the silicon nitride in areas between adjacent gate regions. Etching is then performed, and thereafter the mask is stripped.

Figure 8:
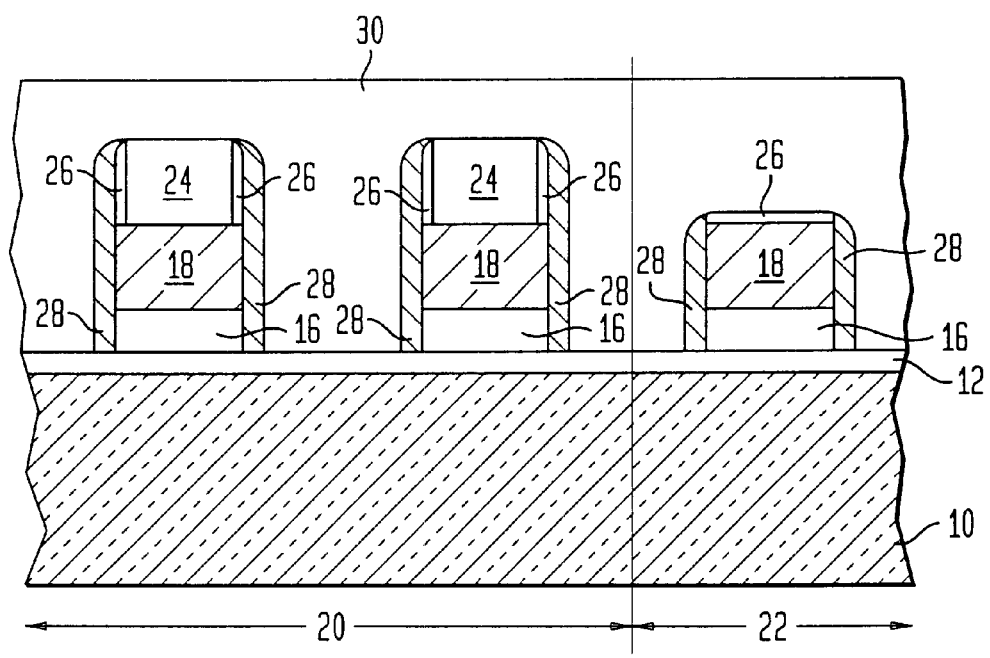
FIG. 8–10 are cross-sectional views illustrating one alternative embodiment of the first embodiment wherein borderless bitline contacts are formed in the structure.
Figure 9:
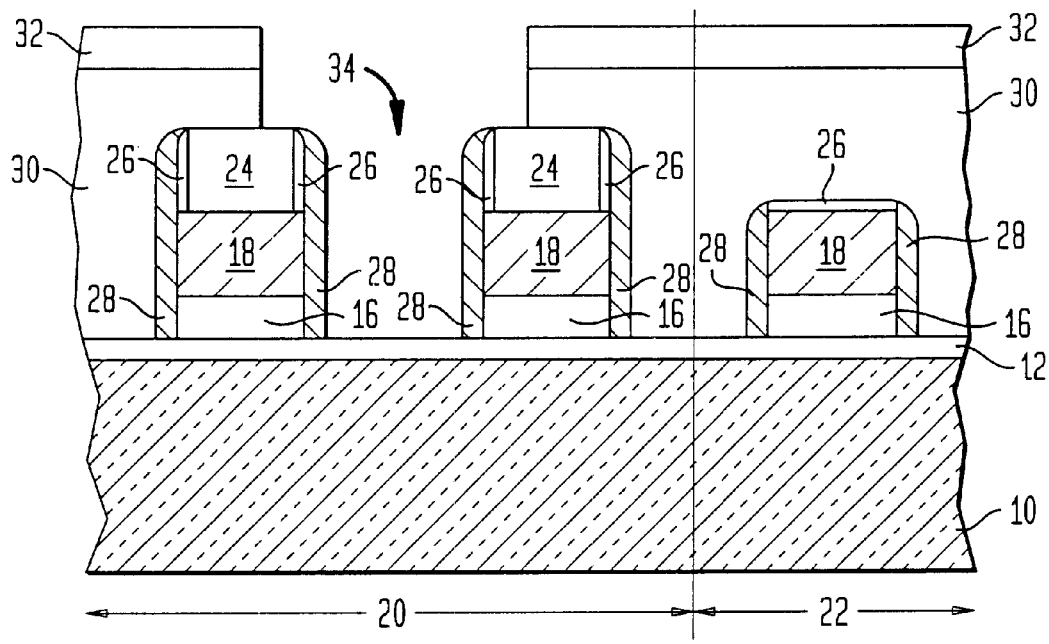
Figure 10:
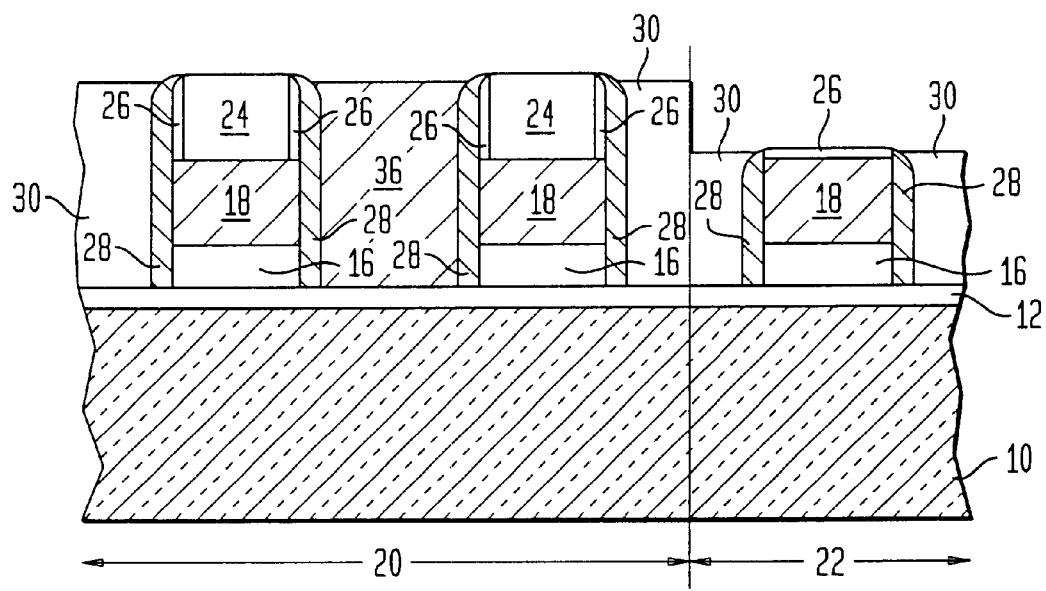
Figure 11:
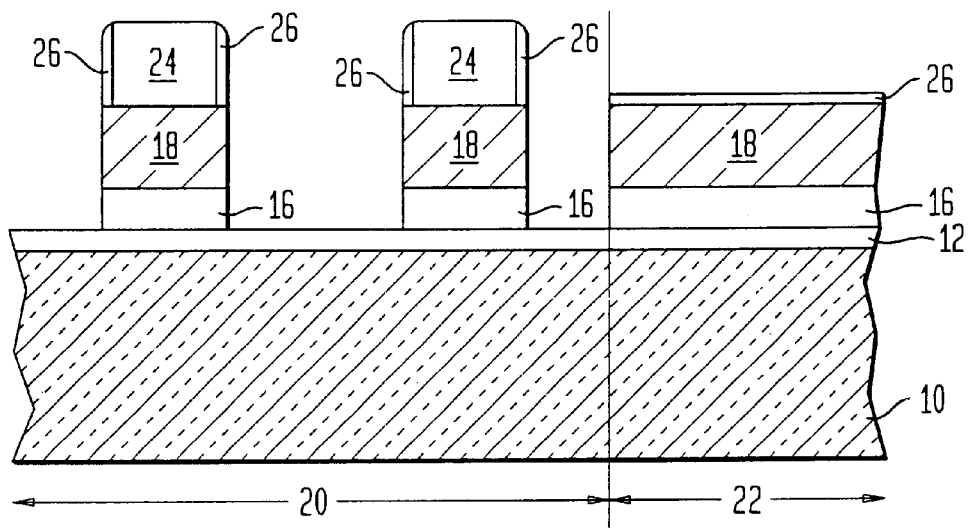
FIGS. 11–14 are cross-sectional views illustrating a second embodiment of the present invention wherein the array and support conductor material are etched separately.

FIGS. 8–10 show an embodiment of the present invention wherein borderless contacts are formed in the structure shown in FIG. 7. Specifically, as shown in FIG. 8, dielectric material 30 such as boron phosphorus silicate glass (BPSG) or boron silicate glass (BSG) is deposited utilizing conventional techniques such as spin-on coating, CVD or high density plasma CVD on all exposed surfaces of the structure in both the array and support device regions and thereafter a conventional critical mask 32 is formed on dielectric material 30.

The critical mask is then patterned in the array device regions so as to provide a pattern in the structure between gate regions and thereafter RIE or another like dry etching process is performed to form openings 34 for subsequent formation of borderless bitline contacts, See FIG. 9. These borderless contacts are often used for bitline contacts in DRAM cell. Dopant can be implanted in the bitline contact if needed to lower the contact resistance. The resist is then stripped and a conductive material such as W, Pt, Cu, Au and Ag is deposited in the openings utilizing CVD, sputtering, plating, evaporation or some other like deposition process. Following deposition of the conductive material, the resist is stripped and the structure is planarized to the top of the gate regions providing the structure illustrated in FIG. 10. Specifically, the structure shown in FIG. 10 regions of dielectric material 30 and regions of bitline contacts 36 that are borderless.

At this point of the process of the present invention, conventional gate contact and/or diffusion contacts made be formed utilizing conventional techniques well known to those skilled in the art.

Reference is now made to FIGS. 11–14 which illustrates a second embodiment of the present invention. In this embodiment, the gate conductor etching in the array and supports is done in separate steps. Moreover, the processing steps leading up to the formation of the structure shown in FIG. 4 are first performed in this embodiment of the present invention. Next, a block mask is formed, preferably using a patterned photoresist (not shown in these drawings) with a non-critical mid-UV mask on the structure so as to leave the array device regions exposed, while protecting the support device regions. The exposed areas are then subjected to an etching process, i.e., RIE, which etches the gate conductor, but not the dielectric cap, i.e. dielectric layer 12. The photoresist is thereafter stripped by conventional techniques providing the structure shown in FIG. 11. Note that the gate region in the array was defined by the dielectric cap and spacers.

Figure 12:
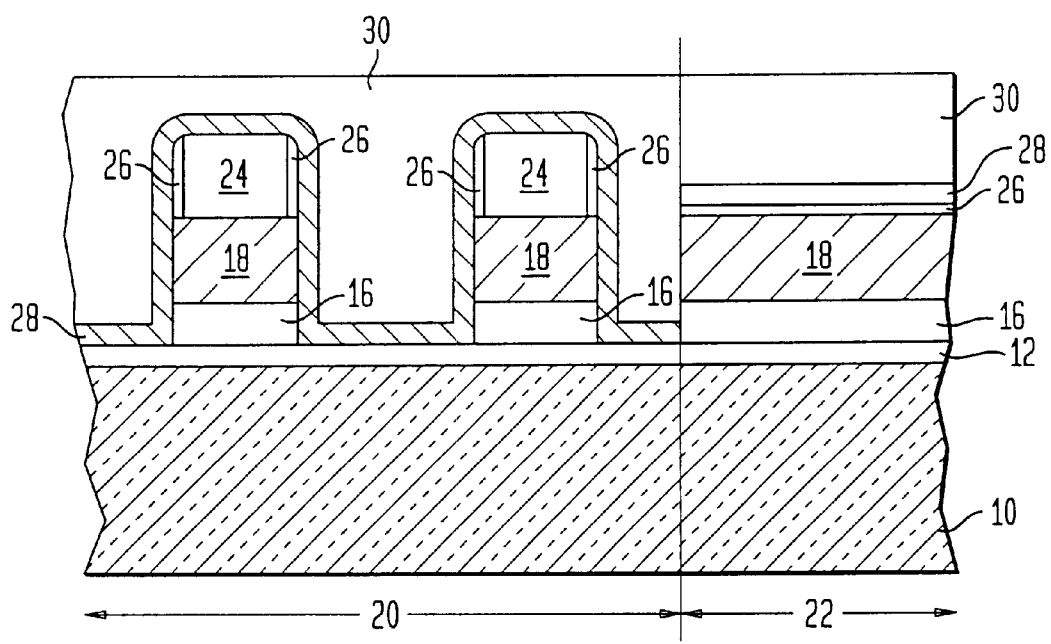
Figure 13:
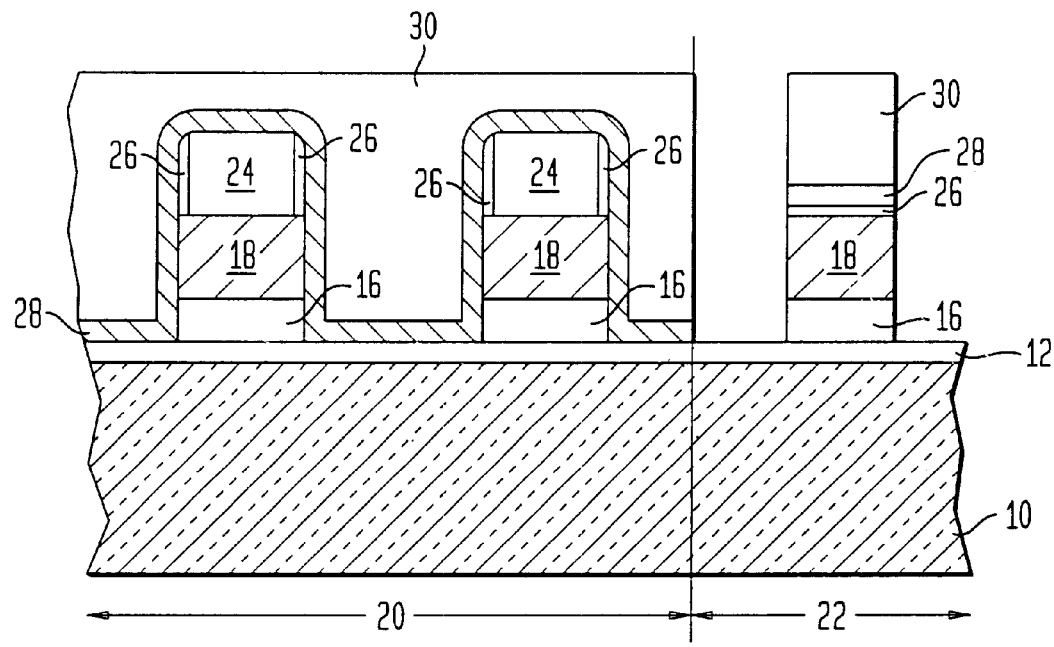
Figure 14:
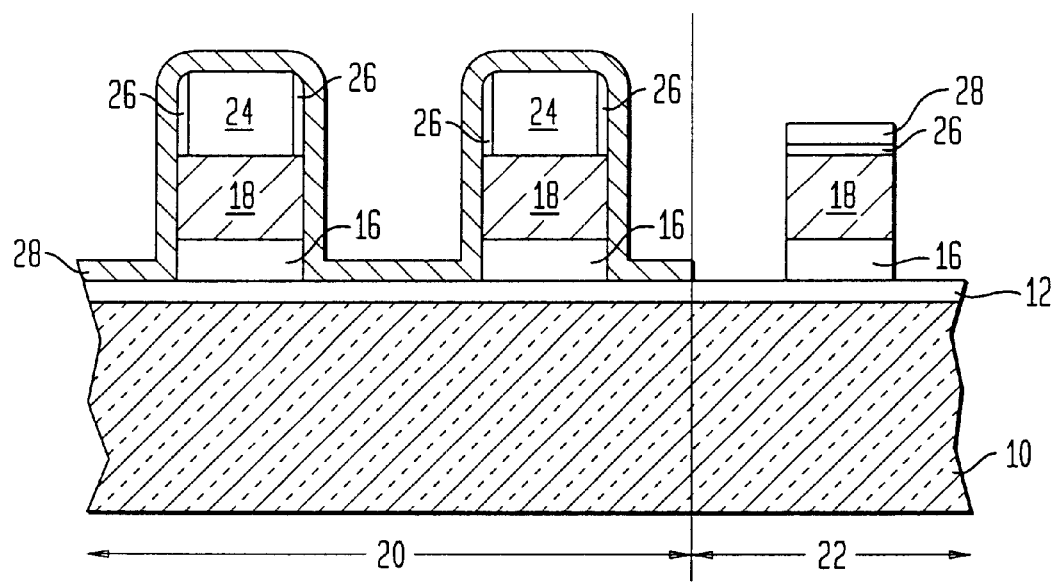

Barrier layer 28 and a layer of doped silicate glass or other like-dielectric 30 are then deposited on all exposed surfaces in the array and support device regions forming the structure shown in FIG. 12. This forms a dielectric masking layer, in the support device regions and fills the regions between the gate conductor lines in the array device regions. Next, a conventional lithography step is performed so as to form resist patterns for the support regions, but blocks the array regions. Dielectric 30 is etched in the support device regions using RIE or other like dry etch process, but not in the array device regions. The resist is then stripped and the support device gate conductor is etched selective to dielectric material 30 and gate dielectric 12 providing the structure shown in FIG. 13. Next, dielectric material 30 is removed in both the support and array device regions utilizing conventional stripping processing well known in the art providing the structure shown in FIG. 14.

Figure 15:
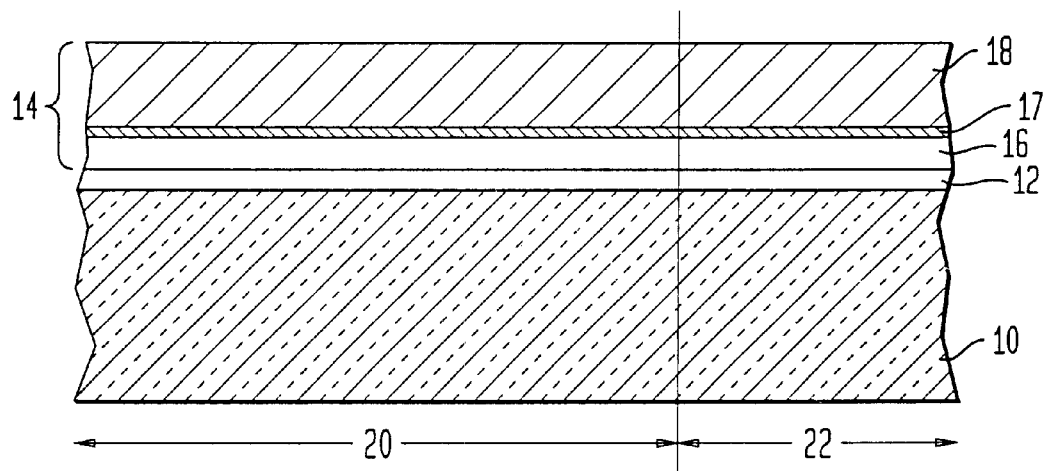
FIGS. 15–26 are cross-sectional views illustrating a third embodiment of the present invention wherein the support device polysilicon gates can be doped during source/drain implantation as is common practice for forming dual work-function gates.

The third embodiment of the present invention will now be described in more detail by referring to FIGS. 15–26. In accordance with this embodiment of the present invention, a structure such as shown in FIG. 15 is first formed. Specifically, the structure shown in FIG. 15 comprises substrate 10, gate dielectric 12 and gate conductor stack 14, which includes undoped polysilicon layer 16, optional barrier layer 17, and silicide layer 18. In addition to a silicide layer, the structure shown in FIG. 15 may utilize a conductive metal such as W in place of silicide layer 18. This structure is formed utilizing the various processes steps employed in forming the structure depicted in FIG. 1.

Figure 16:
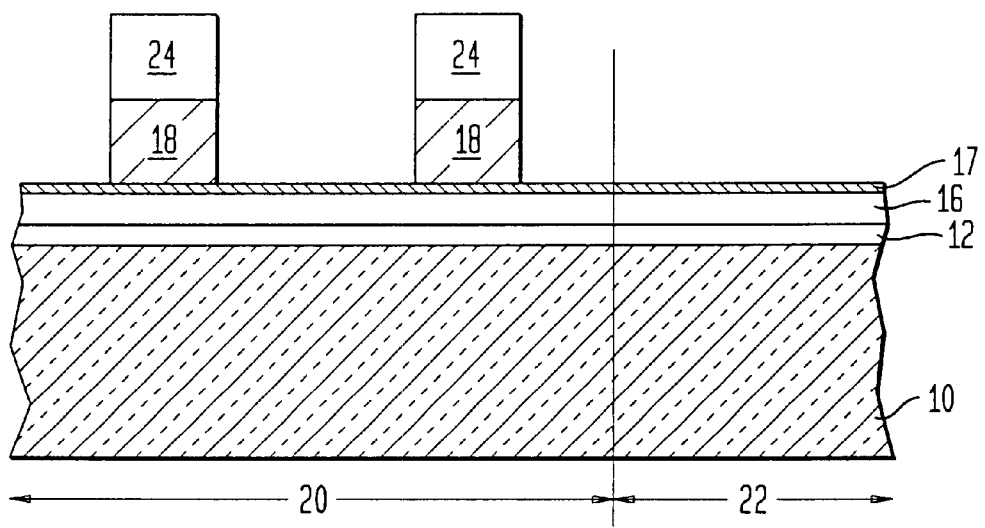

First dielectric cap 24 is then formed on the gate conductor stack shown in FIG. 15 utilizing the materials and processing techniques mentioned above, and thereafter lithography and etching are performed so as to form the structure shown in FIG. 16. In accordance with this aspect of the present invention, the etching process removes unexposed dielectric cap 24 and silicide 18 in the array device regions as well as the support device regions. Although the etching is shown stopping on optional barrier layer 17, the etching process may stop on polysilicon layer 16, thereby completely removing exposed portions of the optional barrier layer in both the array and support device regions. It is noted that in FIG. 16 the gate conductors in the array device regions have been partially etched at this pont of the process.

Figure 17:
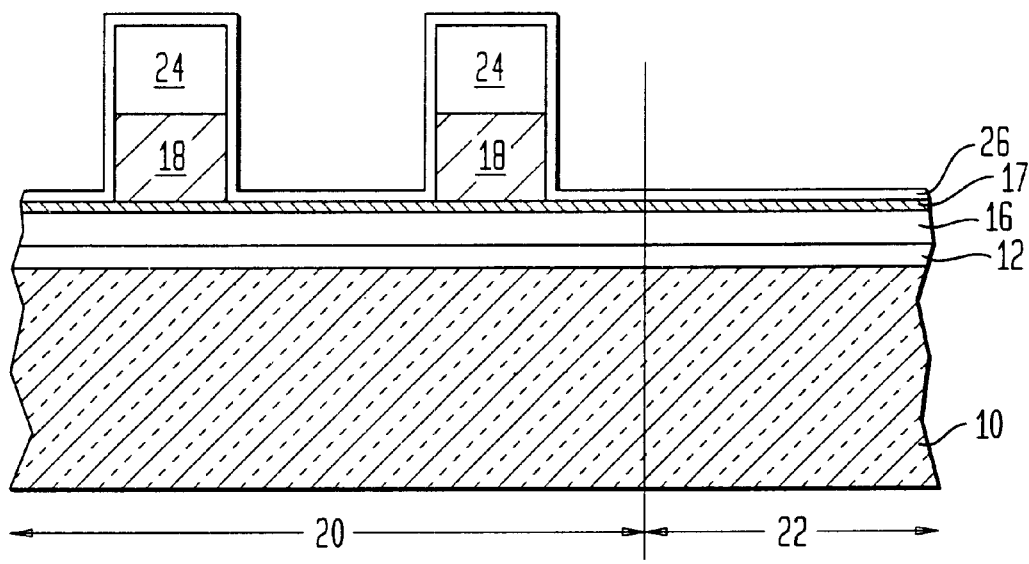

As shown in FIG. 17, second dielectric cap 26 is formed on all exposed surfaces of the structure utilizing one of the previously mentioned deposition processes. A mid-UV mask (not shown in the drawings) is then formed in the support device regions blocking those regions. Next, an etching process, as mentioned above, is performed in the array device regions providing spacers 26 on the vertical sidewalls of the partially etched gate conductor, See FIG. 18. It is also noted that this etching step removes exposed portions of optional barrier layer 17 from the array device regions of the structure.

With the aforementioned mid-UV mask in place, polysilicon layer 16 in the array device regions is now doped with an appropriate dopant utilizing a conventional ion implantation process. The mask is then stripped and the structure is subjected to a conventional annealing process such as rapid thermal annealing (RTA) so as to drive the dopant into the polysilicon beneath the gate conductor regions. This embodiment permits for the doping or counter-doping of the polysilicon layer during source/drain implantations in the support device regions to provide dual work-function gates. Moreover, this embodiment allows the polysilicon to be doped before the array polysilicon is etched from the polysilicon ledges.

Figure 18:
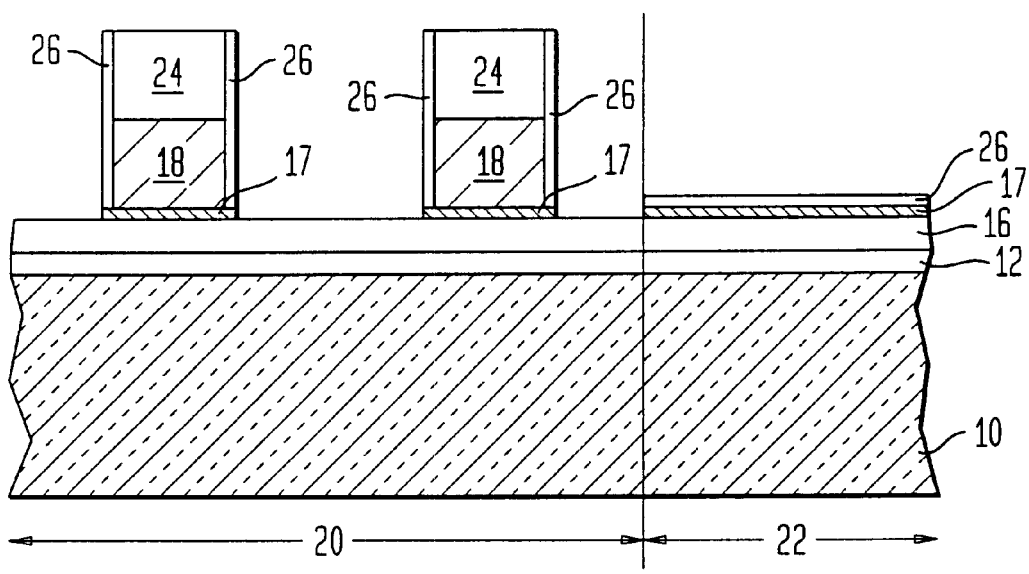
Figure 19:
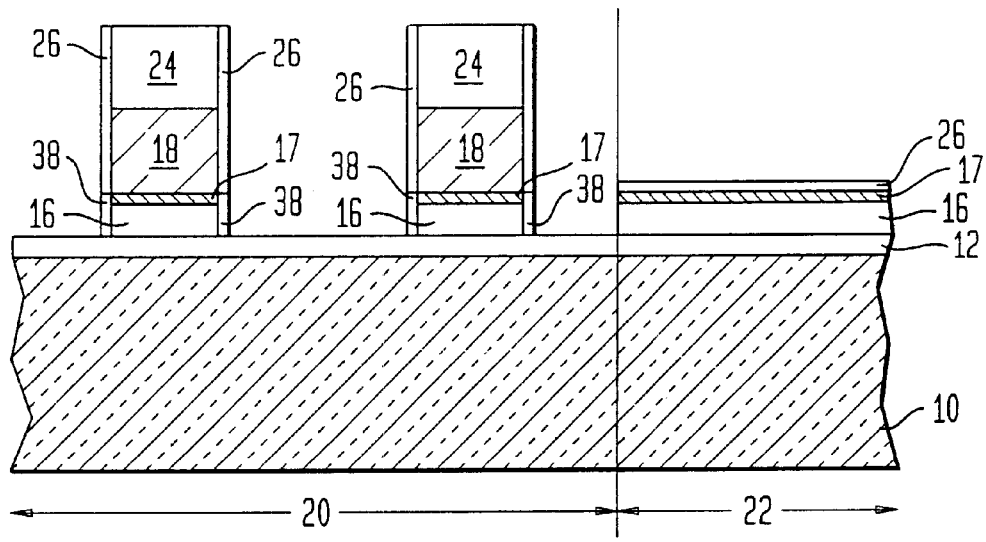

Reference is next made to FIG. 19 which illustrates the structure after performing an array polysilicon etch, an array sidewall gate oxidation and ion implantation. Specially, the structure shown in FIG. 18 is subjected to a selective etching process that removes the doped polysilicon not containing an overlaying dielectric cap. This etching step is carried out by utilizing a conventional dry etch process, a wet chemical etch process or a combination thereof.

A conventional sidewall gate oxidation is then carried out to form sidewall oxide regions 38 on exposed vertical sidewalls of optional barrier 17 and polysilicon layer 16 in the array regions of the structure. Specifically, the gate oxidation process is performed in an oxidizing ambient such as oxygen, ozone, $H_2O$ or NO at a temperature of about 900° C. or greater.

Diffusion implants, which are not shown in the drawings, may now be formed by conventional ion implantation and activation of the diffusion region(s) is achieved by utilizing a conventional annealing process.

Figure 20:
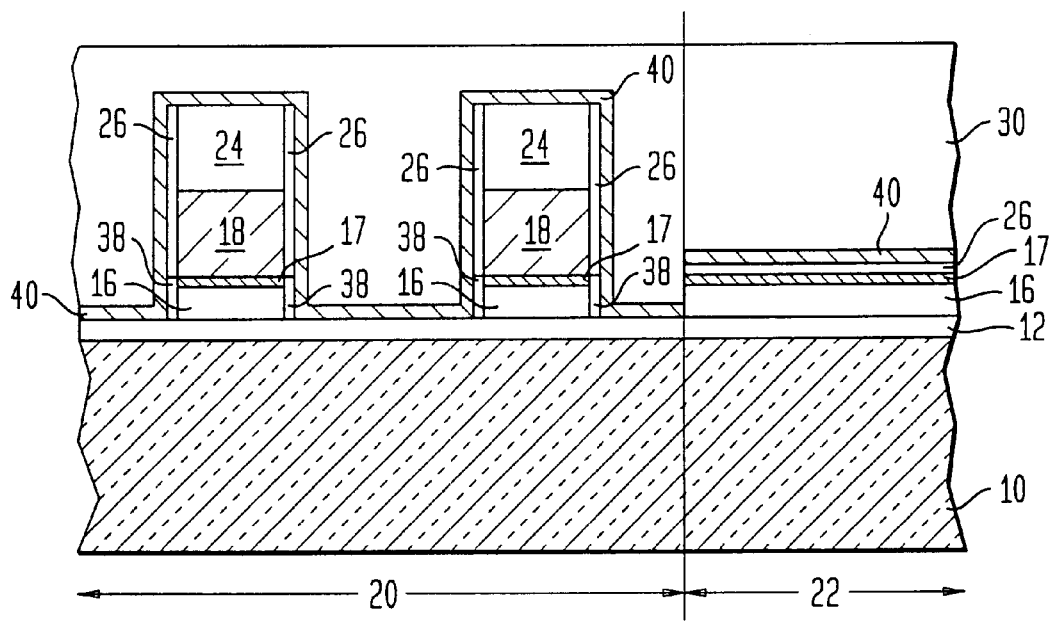
Figure 21:
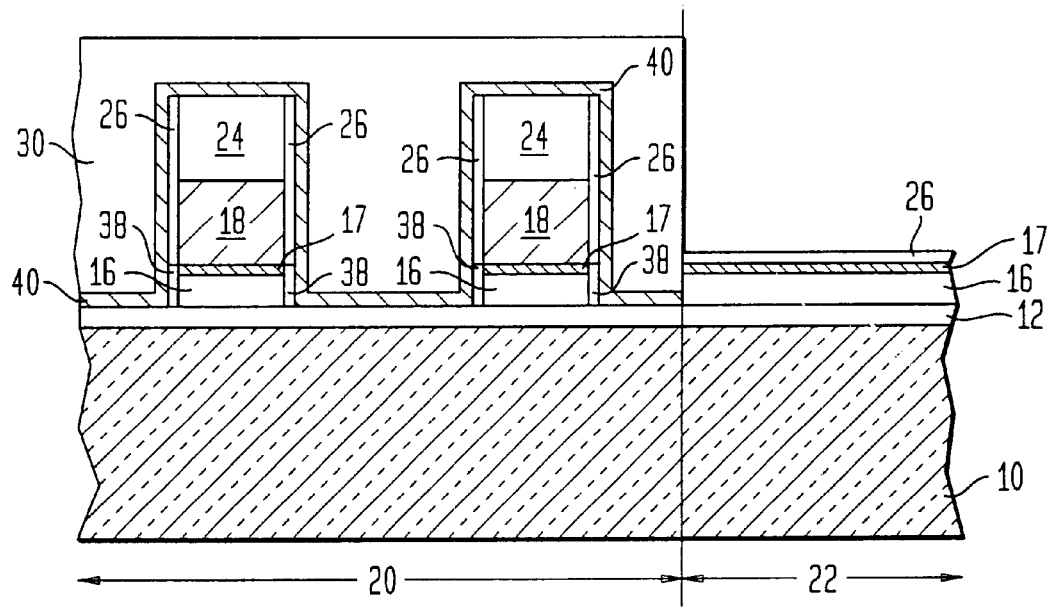
Figure 22:
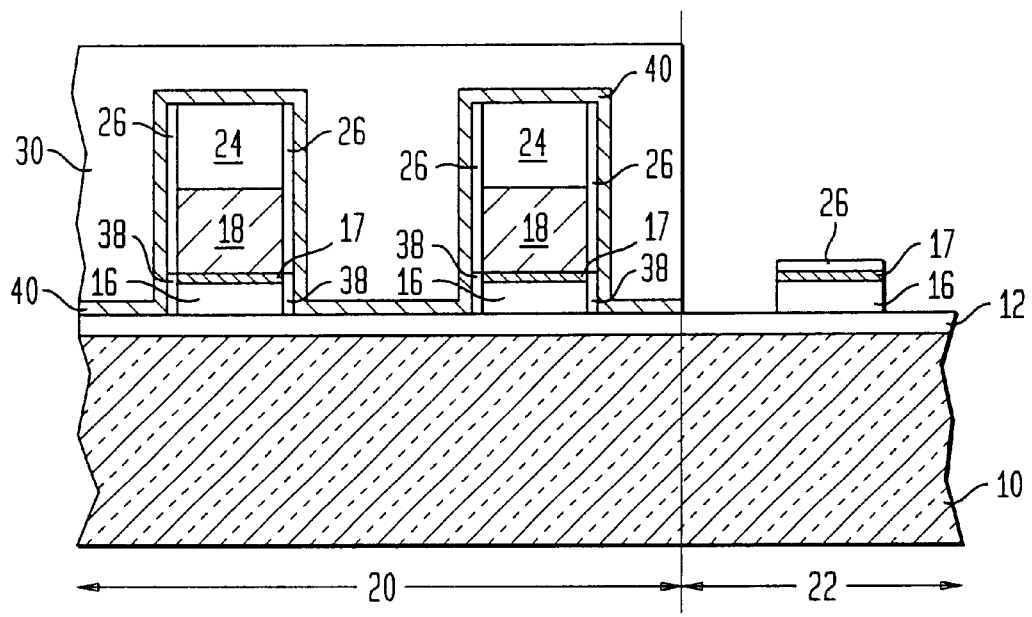

Next, as shown in FIG. 20, an optional oxynitride layer 40 is formed on all exposed surfaces of the structure in the array and support device regions and a dielectric material 30 such as BPSG is then formed on the oxynitride layer. The oxynitride layer may be formed utilizing conventional deposition processes well known to those skilled in the art including CVD, plasma-assisted CVD, sputtering, evaporation, and chemical solution deposition. Dielectric material 30 is formed as described above.

The dielectric material is then subjected to a conventional densification process which is also well known in the art. A mid-UV mask (not shown in the drawings) is then formed on the structure so as to block the array device regions, and dielectric material 30 and oxynitride layer 40 are etched from the support device regions utilizing a standard etching process so as to expose dielectric cap 26. The mid-UV mask is then stripped from the array device regions providing the structure shown in FIG. 21. The array region 20 is now protected by dielectric 30.

After conducting the above-mentioned etching steps, a deep-UV mask (not shown in the drawings) is formed on the array device regions, and a patterned photomask is formed in the support device regions. Exposed areas in the support device regions are then etched stopping on the gate dielectric, i.e., portions of layers 26, 17 and 16 are removed, forming the structure shown in FIG. 22. Conventional dry and/or wet chemical etching may be employed in removing portions of layers 26, 17 and 16 from the support device regions.

Figure 23:
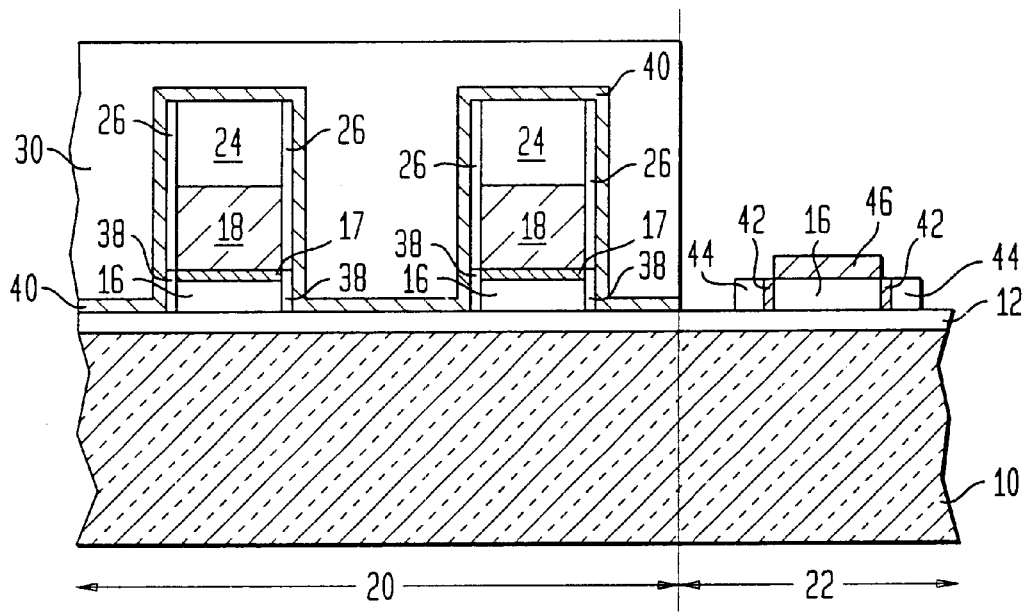

FIG. 23 is an illustration of further processing steps that can be performed in the support device regions. Further processing that can be employed in the present invention include, but are not limited to: forming source/drain (S/D) diffusion regions, forming S/D extensions, forming $V_T$/halo implants and forming a silicide contact on the now patterned gate conductor. These are common to the formation of high-speed MOS devices, but normally difficult to integrate into a process with array devices and borderless contacts. Specifically, dielectric cap 26 and optional barrier layer 17 are removed from the array device regions of the structure shown in FIG. 22 utilizing a conventional etching process that is selective in removing nitride. The vertical sidewalls of the patterned gate conductor region are then subjected to a conventional gate sidewall oxidation process so at form oxide regions 42 therein. A mask (not shown) is then applied to the support device regions and conventional extension/halo implants may be performed. The mask is removed after formation of the extension/halo implants.

Nitride spacers 44 are then formed on oxide regions 42 utilizing a conventional deposition process such as CVD and RIE. The structure may then be subjected to a conventional RTA process and thereafter nitride/oxide spacers 46 are formed by deposition and etching. Next, a second mask is formed on appropriate portions of the structure, source/drain implants and activation annealing may then be performed. It is noted that before the activation annealing step, the second mask is removed from the support device regions of the structure.

A conductive metal such as W, Ti or Co, may then be formed on exposed polysilicon 16 utilizing a conventional deposition process and the conductive metal is then subjected to a conventional salicide process which is capable of converting said conductive metal into suicide layer 46, See FIG. 23.

The above processing can be used in forming NFETs, PFETs or a combination of NFETs and PFETs in the support device regions of the structure.

Figure 24:
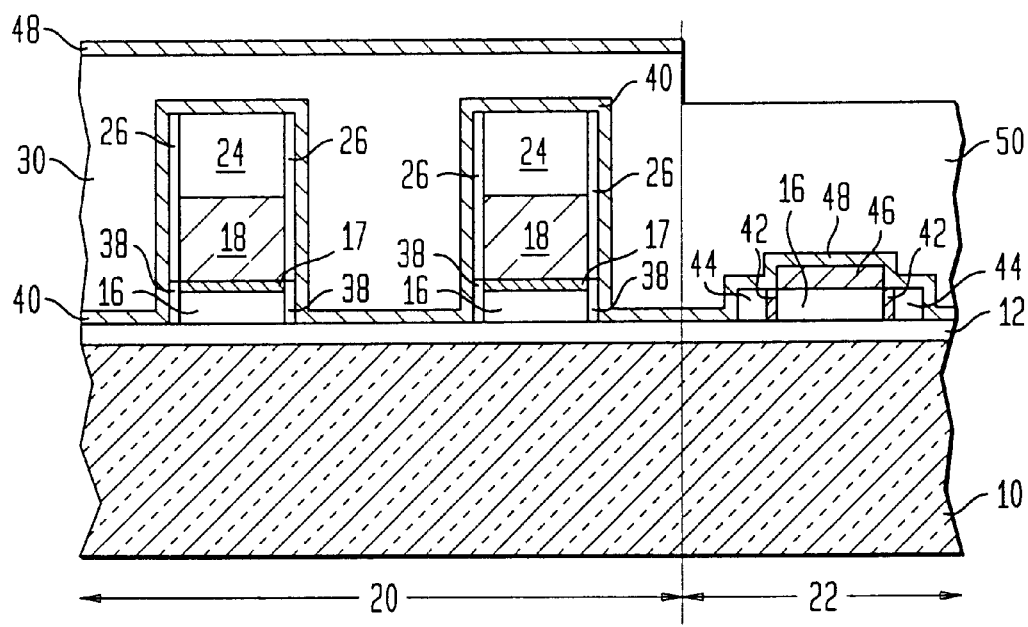

A barrier nitride layer 48 is formed in both the array and support device regions utilizing a conventional deposition process, and thereafter a second dielectric material, such as BPSG, 50 is formed on in both the array and support device regions on barrier layer 48. A low temperature anneal (temperature of about 850° C. or below) is next performed and then dielectric 50 in the array is removed by CMP stopping on barrier layer 48. This structure is shown in FIG. 24.

Figure 25:
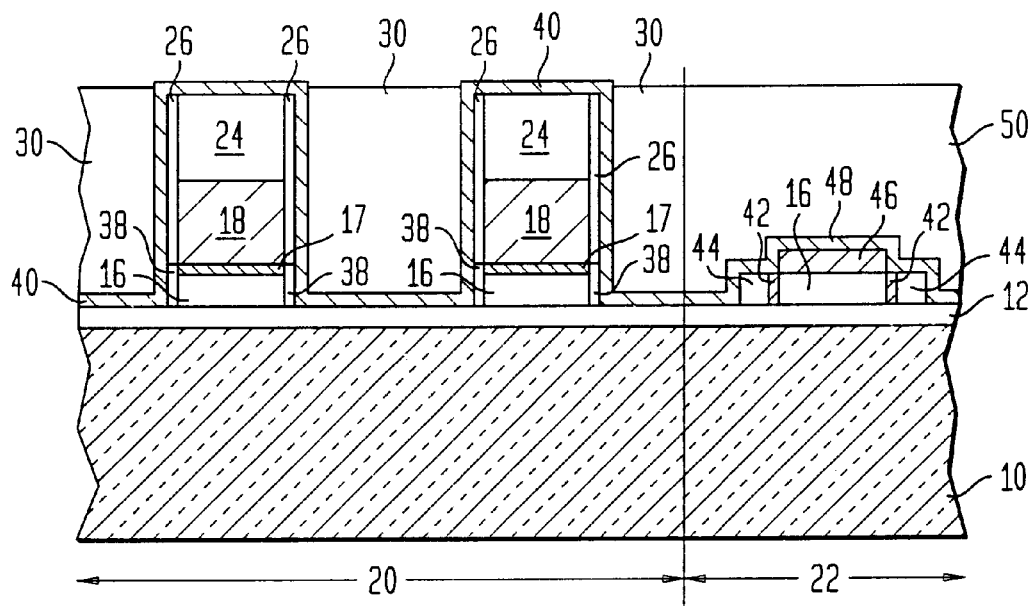
Figure 26:
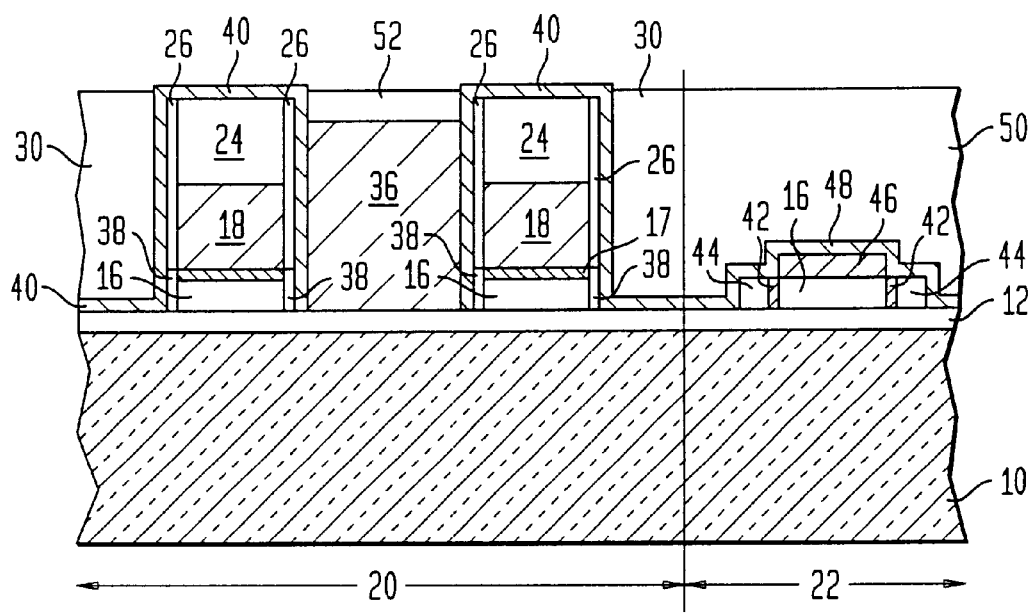

Next, barrier layer 48 is removed from the array regions utilizing a conventional wet chemical etching process and dielectric material 30 which is present in the array device regions is removed by CMP stopping on oxynitride barrier 40, See FIG. 25.

Lithography, etching and deposition, as described above, can be employed in forming bitline contacts 36 in the array device regions. A dielectric cap composed of TEOS (tetraethylorthosilicate) 52 can be formed on top of the bitline contacts utilizing conventional processing including, recessing the bitline contact below the patterned gate conductor, filling said recess area with TEOS, and, if needed, planarizing the structure, See FIG. 26.

Figure 27:
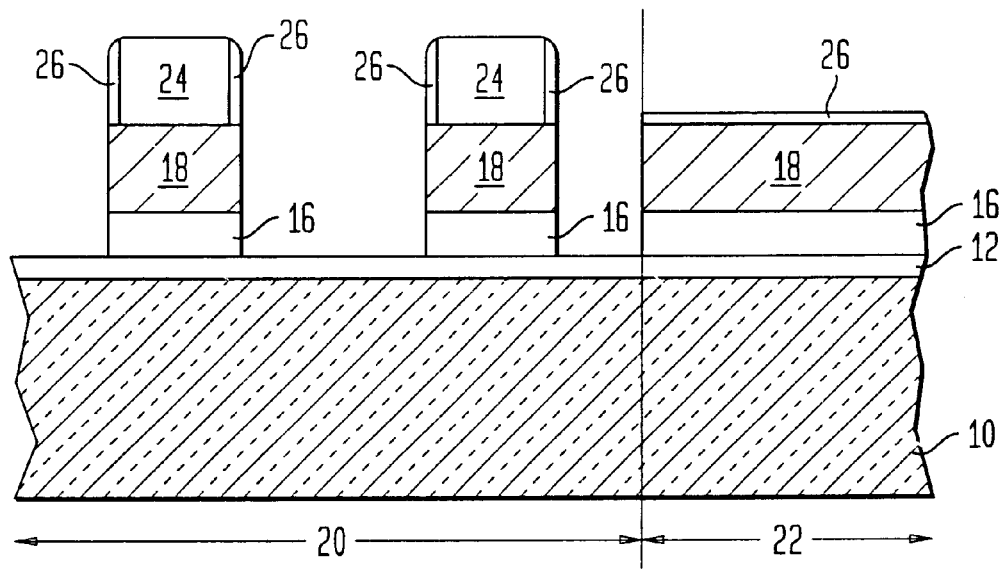
FIGS. 27–29 are cross-sectional views illustrating a fourth embodiment of the present invention wherein the borderless contact in the array can be doped with the same mask that is used to define the support gate patterns.
Figure 28:
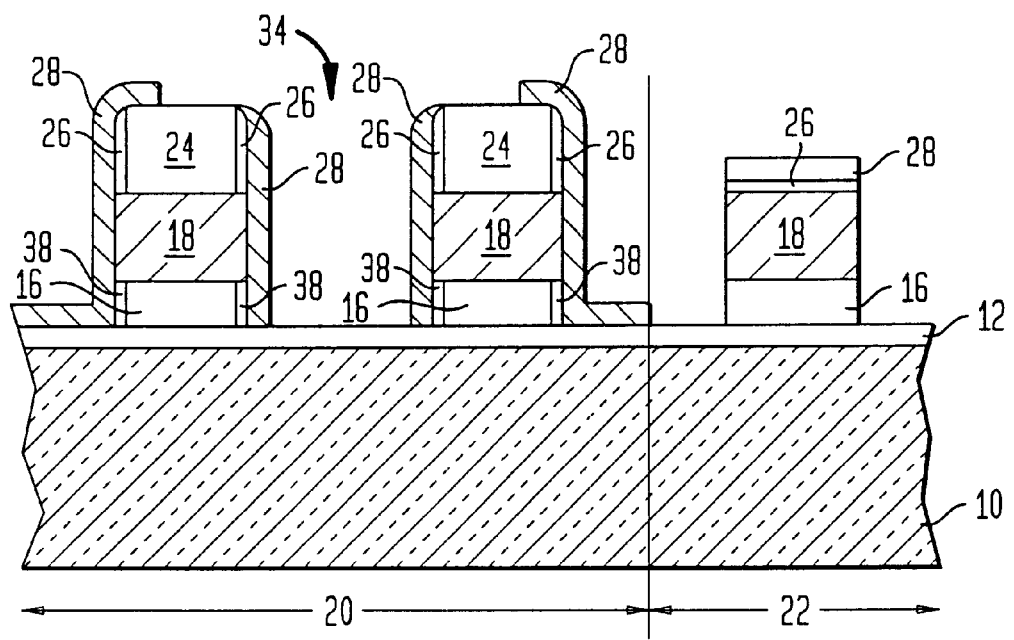
Figure 29:
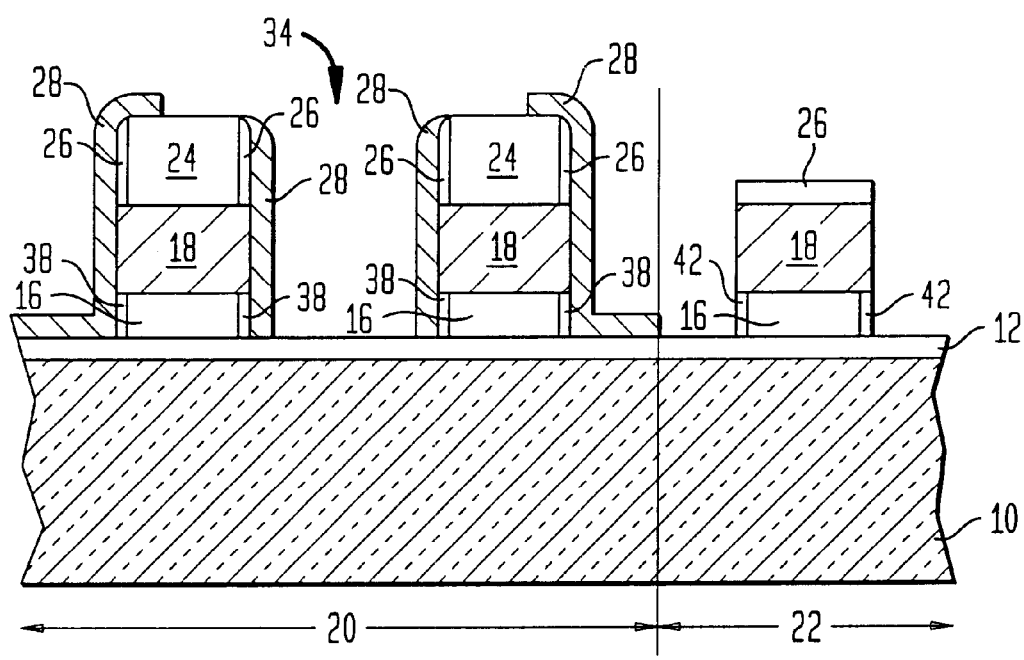

Reference is now made to FIGS. 27–29 which illustrate the fourth embodiment of the present invention that is capable of providing tight $L_{eff}$ tolerance in the support devices as well as improving the array Vt tolerance. Specifically, FIG. 27, illustrates a structure that is formed using the basic processing steps employed in forming the structure in FIG. 11 above. As shown in FIG. 27, the array device region includes a patterned gate region comprising polysilicon layer 16 and silicide layer 18. The array region also includes a first dielectric cap 24 on silicide layer 18 and spacers 26 on the patterned gate conductor. The support device regions, on the other hand, comprise a material stack that includes polysilicon layer 16, silicide layer 18 and dielectric cap 26.

The resist employed in forming the structure shown in FIG. 27 is then stripped and the array gates are subjected to a large bird's beak sidewall oxidation so as to form oxide region 38 on the vertical sidewalls of the array polysilicon. This sidewall oxidation is carried out as described above. The dielectric cap, i.e., layer 26, in the support device regions of the structure protects the support gate stack from this oxidation.

At this point of the process, the array regions are either implanted with a shallow implant or the array extension junctions are formed by depositing a doped silicate glass layer, annealing the structure to drive-in the dopant, and then the silicate glass layer is removed from the structure.

Silicon nitride layer barrier 28 is then deposited using a PE-(plasma-enhanced) CVD process in both regions of the structure. A critical mask (not shown in the drawings) which is used to define openings 34 in the array device regions as well as to define the support gate conductor is simultaneously formed in each region of the structure. Silicon nitride barrier 28 is then etched, i.e., RIE, to form spacers 28 in the array device regions only and at the same time the support device regions are patterned and etched. This structure after resist stripping is shown in FIG. 28.

BSG or other like dielectric material is blanket deposited over array gate conductors and the dopant from that layer is driven-in to form a halo diffusion from the bitline of the array. The BSG is then stripped, and an additional blanket As/P dopant may be added to avoid counter-doping of the support gate stack. Alternatively, an oxidation may be performed before the drive-in to lower surface halo concentration. A n-type dopant at this point of the process would allow for W studs in the array regions.

A block mask (not shown in the drawings) is then provided to block the array as the support stack is etched. FIG. 29 shows the structure after oxide region 42 is formed in the support regions utilizing a conventional gate sidewall oxidation process. This oxide region which is thinner the array oxidation performed above, allows for ultra-shallow junction formation in the support device regions. Standard processing or any of the embodiments mentioned above are performed after the block mask has been stripped from the structure.

In an alternative processing scheme of this embodiment of the present invention, the structure shown in FIG. 27 is formed and thereafter BSG (or other doped silicate glass material) is deposited and driven-in to form a halo implant in the array device regions. This allows the array device threshold voltage to be set at this point of the process. The BSG is then stripped selective to the underlying sidewall oxide. Note that one could perform a vertical $N_2$ implant at this step to cause a thicker sidewall oxide along the gate polysilicon layer, but a thinner oxide through which the BSG outdiffuses. Also, additional ASG deposition/drive-in/strip or a shallow n-type implant may be performed at this point of the process. All dopants are blocked from the supports by the silicon nitride barrier layer mentioned above.

A thin nitride layer, as described above, is then deposited and the processing steps leading up to FIG. 28 are next performed. An n-type dopant may now be optionally implanted in the bitline contact region. This optional implant would allow for a W stud in the array and would just increase the n-type dopant in the support devices. The processing steps mentioned above in connection with the structure shown in FIG. 29 can then be performed.

In yet another alternative embodiment of the process shown in FIGS. 27–29, silicon nitride layer 28 is not formed in the structure. This eliminates the spacer etch and simplifies the overall processing scheme.

It is emphasized herein that each of the above mentioned embodiments contemplate the use of various other processing steps mentioned above. For example, in FIGS. 15–26, spacers 28 in the array device regions may be formed only between adjacent gate conductors. Likewise, the processing steps in forming the support devices may be performed on any of the embodiments illustrated in FIGS. 1–14.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for defining gate conductors in both array and support device regions of a semiconductor integrated circuit, comprising:

(a) forming a gate conductor stack on a surface of a gate dielectric, said gate dielectric is formed on a surface of a semiconductor substrate having at least one array device region and at least one support device region;

(b) forming a first gate dielectric cap on at least the gate conductor stack in said at least one array device region;

(c) selectively patterning and etching the first gate dielectric cap in said at least one array device region, said first gate dielectric cap not being present in said at least one support device region after said etching;

(d) forming a second gate dielectric cap on all exposed surfaces in said at least one array device region and in said at least one support device region, said second gate dielectric cap being thinner than said first gate dielectric cap;

(e) selectively etching said second gate dielectric cap in said at least one array device region and in said at least one support device region, wherein said second etched gate dielectric cap in said at least one support device region serves as a gate conductor mask; and (f) simultaneously etching exposed surfaces of said gate conductor stack in both said at least one array device region and said at least one support device region stopping on said gate dielectric, wherein said simultaneous etching provides a plurality of patterned gate stacks in both said at least one array device region and said at least one support device region.

2. The method of claim 1 wherein during step (e) said etched second gate dielectric cap in said at least one array device region forms sidewall spacers on said first etched gate dielectric cap.

3. The method of claim 1 wherein said gate conductor stack includes at least a polysilicon layer and a salicide layer.

4. The method of claim 1 wherein said gate conductor stack includes a metal.

5. The method of claim 1 wherein said gate conductor stack is formed by depositing a barrier layer on said gate dielectric and a metal on said barrier layer.

6. The method of claim 3 wherein said salicide layer is formed by a salicide process.

7. The method of claim 6 wherein said salicide process includes depositing a conductive material on said polysilicon layer and annealing said conductive material.

8. The method of claim 3 wherein an optional barrier layer is formed between said polysilicon layer and said silicide layer.

9. The method of claim 3 wherein said polysilicon layer is a doped polysilicon layer.

10. The method of claim 9 wherein said doped polysilicon layer is formed utilizing an in-situ doping deposition process or deposition and ion implantation.

11. The method of claim 1 wherein said first dielectric cap is formed in both the at least one array device region and the at least one support device region.

12. The method of claim 1 wherein said first dielectric cap is formed by a deposition process selected from the group consisting of CVD, plasma-assisted CVD, evaporation, sputtering and reactive sputtering.

13. The method of claim 1 wherein step (c) includes lithography and etching.

14. The method of claim 1 wherein said second dielectric cap is composed of the same or different dielectric as the first dielectric cap.

15. The method of claim 1 wherein said second dielectric cap has a thickness of from about 10 to about 30 nm.

16. The method of claim 1 wherein said second dielectric cap comprises TEOS.

17. The method of claim 1 wherein said second dielectric comprises a multilayer of $Si_3N_4$ and a doped silicate glass.

18. The method of claim 1 wherein step (e) includes an anisotropic etching process.

19. The method of claim 1 wherein step (f) includes a dry etching process.

20. The method of claim 19 wherein said dry etching process is selected from the group consisting of RIE, ion-beam etching and plasma-etching.

21. The method of claim 1 further comprising:
(g) forming a silicon nitride layer on all exposed surfaces of the structure provided in step (f); and
(h) etching said silicon nitride layer so as to form spacers in the at least one array device region and the at least one support device region.

22. The method of claim 21 wherein said spacers are selectively formed between two adjacent gate regions in said at least one array device region.

23. The method of claim 21 further comprising forming a bitline contact in between said spacers in said at least one array device region.

24. The method of claim 23 wherein said bitline contact is formed by depositing a dielectric material on all surfaces in said at least one array device region and said at least one support device region, applying a mask to said dielectric material, patterning said mask in said at least one array device region, developing the pattern, etching through said pattern stopping on said gate dielectric, and filling said etched area with a conductive material.

25. The method of claim 24 wherein diffusion implants, extension implants, $V_T$ implants, halo implants or any combination thereof are performed prior to filling said etched area.

26. The method of claim 24 wherein said dielectric material is a doped silicate glass.

27. The method of claim 26 wherein said doped silicate glass is annealed so as to drive-in dopant.

28. The method of claim 1 wherein second dielectric cap in said at least one support device region is covered with a blocking mask so that the second dielectric cap in the at least one support device region is not etched by step (e).

29. The method of claim 28 further comprising applying a dielectric material to all exposed surfaces in said at least one array device region and said at least one support device region, selectively patterning said dielectric material in said at least one support device region, etching exposed surfaces in said at least one support device region so as to provide a patterned gate stack region containing said dielectric material as a hard mask; and removing said dielectric material in both said at least one array device region and said at least one support device region.

30. The method of claim 1 further comprising forming an oxide region in said patterned gate stack in said at least one support device region, forming nitride spacers on said oxide region, forming nitride/oxide spacers on said nitride spacers and providing a salicide layer to a top surface of said patterned gate stack.

* * * * *